(12) United States Patent
Liu et al.

(10) Patent No.: US 11,930,651 B2
(45) Date of Patent: Mar. 12, 2024

(54) ORGANIC LUMINESCENT MATERIAL, ORGANIC ELECTROLUMINESCENT ELEMENT AND DISPLAY DEVICE

(71) Applicant: BOE Technology Group Co., Ltd., Beijing (CN)

(72) Inventors: Xinghua Liu, Beijing (CN); Xiaojin Zhang, Beijing (CN); Haiyan Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 302 days.

(21) Appl. No.: 17/344,809

(22) Filed: Jun. 10, 2021

(65) Prior Publication Data

US 2021/0391552 A1   Dec. 16, 2021

(30) Foreign Application Priority Data

Jun. 11, 2020 (CN) .......................... 202010530024.3

(51) Int. Cl.
| | |
|---|---|
| H10K 50/11 | (2023.01) |
| H10K 50/18 | (2023.01) |
| H10K 101/40 | (2023.01) |
| H10K 101/10 | (2023.01) |
| H10K 101/30 | (2023.01) |

(52) U.S. Cl.
CPC ............ *H10K 50/11* (2023.02); *H10K 50/18* (2023.02); *H10K 2101/10* (2023.02); *H10K 2101/30* (2023.02); *H10K 2101/40* (2023.02)

(58) Field of Classification Search
CPC .... H10K 50/11; H10K 2101/40; H10K 50/18; H10K 2101/10; H10K 2101/30; H10K 2101/20; H10K 50/121; H10K 59/10; H10K 50/00–88; H10K 59/00–95; H10K 65/00; H10K 71/00–861; H10K 85/00–791; H10K 2101/00–90; H10K 2102/00–361; B32B 2457/206

See application file for complete search history.

(56) References Cited

U.S. PATENT DOCUMENTS

2023/0269955 A1\*  8/2023  Ohsawa ............... H10K 50/121
                                                                257/40

\* cited by examiner

*Primary Examiner* — Mohammad A Rahman
(74) *Attorney, Agent, or Firm* — IPro, PLLC

(57) ABSTRACT

Organic luminescent material, includes: host material, TADF sensitizer, and fluorescent-luminescent material; wherein absolute value of difference between LUMO level of the host material and LUMO level of the TADF sensitizer is not more than 0.4 eV, and absolute-value of difference between HOMO level of the host material and HOMO level of the TADF sensitizer is not more than 0.4 eV; absolute-value of LUMO level of the fluorescent-luminescent material is not more than absolute-value of the LUMO level of the host material and the LUMO level of the TADF sensitizer, and/or absolute-value of HOMO level of the fluorescent-luminescent material is not less than an absolute-value of the HOMO level of the host material and absolute-value of the HOMO level of the TADF sensitizer; and emission-spectrum of the host material overlaps an absorption-spectrum of the TADF sensitizer, and emission-spectrum of the TADF sensitizer overlaps absorption-spectrum of the fluorescent-luminescent material.

20 Claims, 4 Drawing Sheets

ORGANIC LUMINESCENT MATERIAL, ORGANIC ELECTROLUMINESCENT ELEMENT AND DISPLAY DEVICE

CROSS REFERENCES TO RELATED APPLICATIONS

This disclosure claims the priority of a Chinese patent application filed with the Chinese Patent Office, with application number 202010530024.3, entitled "Organic Luminescent Materials, Organic Electroluminescent Elements and Display Devices" on Jun. 11, 2020, the entire contents of which are incorporated by reference In this disclosure.

TECHNICAL FIELD

Embodiments of the present disclosure relate to an organic luminescent material, an organic electroluminescent element, and a display device.

BACKGROUND

Organic Light Emitting Diode (abbreviated as OLED) is known as the next-generation display due to its advantages of self-luminescence, high efficiency, bright color, light and thin, lower power consumption, and rollability, and has attracted more and more attention in recent years.

In the technology known to the inventors, organic electroluminescent materials are mainly divided into fluorescent materials and phosphorescent materials. The luminescence internal quantum efficiency of the phosphorescent materials can reach 100% theoretically, but due to precious metal iridium included in the phosphorescent materials, its price is expensive, and currently green and red phosphorescent luminescent materials have been commercially available, but blue phosphorescent materials have not been commercially available yet. Fluorescent materials are pure organic dyes, which are relatively cheap, however, they have low luminous efficiency (internal quantum efficiency is only 25%).

SUMMARY

At least one embodiments of the present disclosure provides an organic luminescent material, including: a host material, a thermally activated delayed fluorescence (TADF) sensitizer, and a fluorescent luminescent material; wherein an absolute value of a difference between an LUMO energy level of the host material and an LUMO energy level of the TADF sensitizer is less than or equal to 0.4 eV, and an absolute value of a difference between a HOMO energy level of the host material and a HOMO energy level of the TADF sensitizer is less than or equal to 0.4 eV; an absolute value of an LUMO energy level of the fluorescent luminescent material is less than or equal to an absolute value of the LUMO energy level of the host material, and the absolute value of the LUMO energy level of the fluorescent luminescent material is less than or equal to an absolute value of the LUMO energy level of the TADF sensitizer, and/or an absolute value of a HOMO energy level of the fluorescent luminescent material is greater than or equal to an absolute value of the HOMO energy level of the host material and the absolute value of the HOMO energy level of the fluorescent luminescent material is greater than or equal to an absolute value of the HOMO energy level of the TADF sensitizer; and an emission spectrum of the host material overlaps an absorption spectrum of the TADF sensitizer, and an emission spectrum of the TADF sensitizer overlaps an absorption spectrum of the fluorescent luminescent material.

In some embodiments of the present disclosure, the host material includes a TADF host material.

In some embodiments of the present disclosure, a maximum value of a difference between a singlet energy level of the TADF host material and a triplet energy level of the TADF host material is 0.25 eV.

In some embodiments of the present disclosure, the host material includes a non-TADF host material.

In some embodiments of the present disclosure, a maximum value of a difference between a singlet energy level of the TADF sensitizer and a triplet energy level of the TADF sensitizer is 0.25 eV.

In some embodiments of the present disclosure, a mole ratio of the host material ranges from 50% to 95%, and a mole ratio of the TADF sensitizer ranges from 5% to 50%, a mole ratio of the fluorescent luminescent material ranges from 0.2% to 4%, and a sum of the mole ratio of the host material, the mole ratio of the TADF sensitizer, and the mole ratio of the fluorescent luminescent material is 100%.

In some embodiments of the present disclosure, a triplet energy level of the host material is greater than a triplet energy level of the TADF sensitizer, and the triplet energy level of the TADF sensitizer is greater than a triplet energy level of the fluorescent material.

At least one embodiment of the present disclosure provides an organic electroluminescence element, including an anode, a cathode, and an organic light-emitting layer disposed between the anode and the cathode, and material of the organic light-emitting layer including a host material, a TADF sensitizer, and a fluorescent luminescent material; wherein an absolute value of a difference between an LUMO energy level of the host material and an LUMO energy level of the TADF sensitizer is less than or equal to 0.4 eV, and an absolute value of a difference between a HOMO energy level of the host material and a HOMO energy level of the TADF sensitizer is less than or equal to 0.4 eV; an absolute value of an LUMO energy level of the fluorescent luminescent material is less than or equal to an absolute value of the LUMO energy level of the host material, and the absolute value of the LUMO energy level of the fluorescent luminescent material is less than or equal to an absolute value of the LUMO energy level of the TADF sensitizer, and/or an absolute value of a HOMO energy level of the fluorescent luminescent material is greater than or equal to an absolute value of the HOMO energy level of the host material and the absolute value of the HOMO energy level of the fluorescent luminescent material is greater than or equal to an absolute value of the HOMO energy level of the TADF sensitizer; and an emission spectrum of the host material overlaps an absorption spectrum of the TADF sensitizer, and an emission spectrum of the TADF sensitizer overlaps an absorption spectrum of the fluorescent luminescent material.

In some embodiments of the present disclosure, the organic electroluminescence element further includes a hole transport layer disposed between the anode and the organic light emitting layer, the hole transport layer including a hole transport material; wherein a difference between a HOMO energy level of the hole transport layer and the HOMO energy level of the host material is less than 0.2 eV.

In some embodiments of the present disclosure, the organic electroluminescence element further includes a hole transport layer disposed between the anode and the organic light emitting layer, the hole transport layer including a hole transport material; wherein a triplet energy level of the hole transport material is greater than a triplet energy level of the host material, the triplet energy level of the hole transport material is greater than a triplet energy level of the TADF sensitizer, and the triplet energy level of the hole transport material is greater than a triplet energy level of the fluorescent luminescent material.

In some embodiments of the present disclosure, the organic electroluminescence element further includes a hole transport layer and an electron blocking layer disposed between the anode and the organic light emitting layer, the hole transport layer disposed close to the anode, the electron blocking layer disposed close to the organic light-emitting layer, and the electron blocking layer including an electron blocking material; wherein a difference between a HOMO energy level of the electron blocking material and the HOMO energy level of the host material is less than 0.2 eV.

In some embodiments of the present disclosure, the organic electroluminescence element further includes a hole transport layer and an electron blocking layer disposed between the anode and the organic light emitting layer, the hole transport layer disposed close to the anode, the electron blocking layer disposed close to the organic light-emitting layer, and the electron blocking layer including an electron blocking material; wherein a triplet energy level of the electron blocking material is greater than a triplet energy level of the host material, the triplet energy level of the electron blocking material is greater than a triplet energy level of the TADF sensitizer, and the triplet energy level of the electron blocking material is greater than a triplet energy level of the fluorescent material.

In some embodiments of the present disclosure, the organic electroluminescence element further includes an electron transport layer disposed between the cathode and the organic light emitting layer, and the electron transport layer including an electron transport material; wherein a difference between an LUMO energy level of the electron transport material and the LUMO energy level of the host material is less than 0.2 eV.

In some embodiments of the present disclosure, the organic electroluminescence element further includes an electron transport layer disposed between the cathode and the organic light emitting layer, and the electron transport layer including an electron transport material; a triplet energy level of the electron transport material is greater than a triplet energy level of the host material, the triplet energy level of the electron transport material is greater than a triplet energy level of the TADF sensitizer, and the triplet energy level of the electron transport material is greater than a triplet energy level of the fluorescent material.

In some embodiments of the present disclosure, the organic electroluminescence element further includes an electron transport layer and a hole blocking layer disposed between the cathode and the organic light emitting layer, the electron transport layer disposed close to the cathode, the hole blocking layer disposed close to the organic light-emitting layer, and the hole blocking layer including a hole blocking material; wherein a difference between an LUMO energy level of the hole blocking material and the LUMO energy level of the host material is less than 0.2 eV.

In some embodiments of the present disclosure, the organic electroluminescence element further includes an electron transport layer and a hole blocking layer disposed between the cathode and the organic light emitting layer, the electron transport layer disposed close to the cathode, the hole blocking layer disposed close to the organic light-emitting layer, and the hole blocking layer including a hole blocking material; wherein a triplet energy level of the hole blocking material is greater than a triplet energy level of the host material, the triplet energy level of the hole blocking material is greater than a triplet energy level of the TADF sensitizer, and the triplet energy level of the blocking material is greater than a triplet energy level of the fluorescent luminescent material.

In some embodiments of the present disclosure, the host material includes a TADF host material.

In some embodiments of the present disclosure, a maximum value of a difference between the singlet energy level of the TADF host material and the triplet energy level of the TADF host material is 0.25 eV.

In some embodiments of the present disclosure, the host material includes a non-TADF host material.

In some embodiments of the present disclosure, a maximum value of a difference between a singlet energy level of the TADF sensitizer and a triplet energy level of the TADF sensitizer is 0.25 eV.

In some embodiments of the present disclosure, a mole ratio of the host material ranges from 50% to 95%, and a mole ratio of the TADF sensitizer ranges from 5% to 50%, a mole ratio of the fluorescent luminescent material ranges from 0.2% to 4%, and a sum of the mole ratio of the host material, the mole ratio of the TADF sensitizer, and the mole ratio of the fluorescent luminescent material is 100%.

In some embodiments of the present disclosure, a triplet energy level of the host material is greater than a triplet energy level of the TADF sensitizer, and the triplet energy level of the TADF sensitizer is greater than a triplet energy level of the fluorescent material.

At least one embodiment of the present disclosure provides a display device including a plurality of any one of the organic electroluminescence elements as discussed above, the plurality of organic electroluminescence elements are arranged in array.

It should be understood that the above general description and the following detailed description are only exemplary and explanatory, and cannot be construed as a limit to the present disclosure.

BRIEF DESCRIPTION OF THE DRAWINGS

The drawings herein are incorporated into the specification and constitute a part of the specification, illustrate embodiments in accordance with the disclosure, and are used to explain the principle of the disclosure together with the specification.

DETAILED DESCRIPTION OF THE EMBODIMENTS

The exemplary embodiments will be described in detail hereinafter, and examples thereof are illustrated in the accompanying drawings. When the following description refers to the drawings, unless otherwise indicated, the same reference signs in different drawings designate the same or similar elements. The implementation manners described in the following exemplary embodiments do not represent all implementation manners consistent with the present disclosure. Rather, they are merely examples of devices and methods consistent with some aspects of the present disclosure as set forth in the appended claims.

Figure 1:
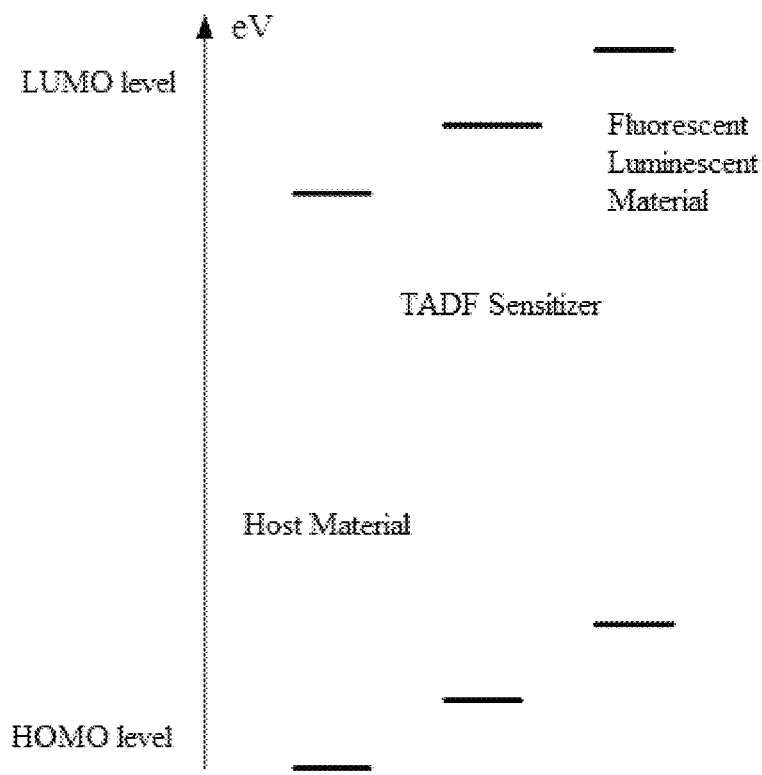
FIG. 1 is diagram illustrating HOMO energy level and LUMO energy level of an organic luminescent material according to an embodiment of the present disclosure.

FIG. 1 is a diagram illustrating a highest occupied molecular orbital (HOMO) energy level and a lowest unoccupied molecular orbital (LUMO) energy level of an organic luminescent material according to an embodiment of the present disclosure.

As illustrated in FIG. 1, the organic luminescent material includes: a host material, a thermally activated delayed fluorescence (TADF) sensitizer and a fluorescent luminescent material, an absolute value of a difference between an LUMO energy level of the host material and an LUMO energy level of the TADF sensitizer is less than or equal to 0.4 eV, an absolute value of a difference between a HOMO energy level of the host material and a HOMO energy level of the TADF sensitizer is less than or equal to 0.4 eV; an absolute value of an LUMO energy level of the fluorescent luminescent material is less than or equal to an absolute value of an LUMO energy level of the host material and the absolute value of an LUMO energy level of the fluorescent luminescent material is less than or equal to the absolute value of the LUMO energy level of the TADF sensitizer, or an absolute value of a HOMO energy level of the fluorescent luminescent material is greater than or equal to an absolute value of the HOMO energy level of the host material, and the absolute value of the HOMO energy level of the fluorescent luminescent material is greater than or equal to an absolute value of the HOMO energy level of the TADF sensitizer; an emission spectrum of the host material overlaps an absorption spectrum of the TADF sensitizer, and an emission spectrum of the TADF sensitizer overlaps with an absorption spectrum of the fluorescent luminescent material.

According to the molecular orbital theory, intermolecular chemical bonds of substances form a series of orbital energy levels. In general, a higher energy orbital is empty (antibonding orbital), and a lower energy orbital has electron configuration (bonding orbital). If a molecule is excited with enough excitation energy, an electron may be excited from a lower energy orbit to a higher energy orbit.

The π electron system of a material determines the electrical and optical properties of an organic molecule. The ground state π electrons form a series of energy levels, which in turn form energy bands. The highest energy level is called Highest Occupied Molecular Orbital (HOMO). The antibonding orbital with the lowest energy is called the Lowest Unoccupied Molecular Orbital (LUMO). A distance from the HOMO energy level to the vacuum energy level corresponds to an ionization potential, and a distance from the LUMO energy level to the vacuum energy level corresponds to an affinity. An electron affinity (EA) and an ionization potential (IP) of an organic luminescent material determine injection efficiencies of electrons and holes.

Figure 2:
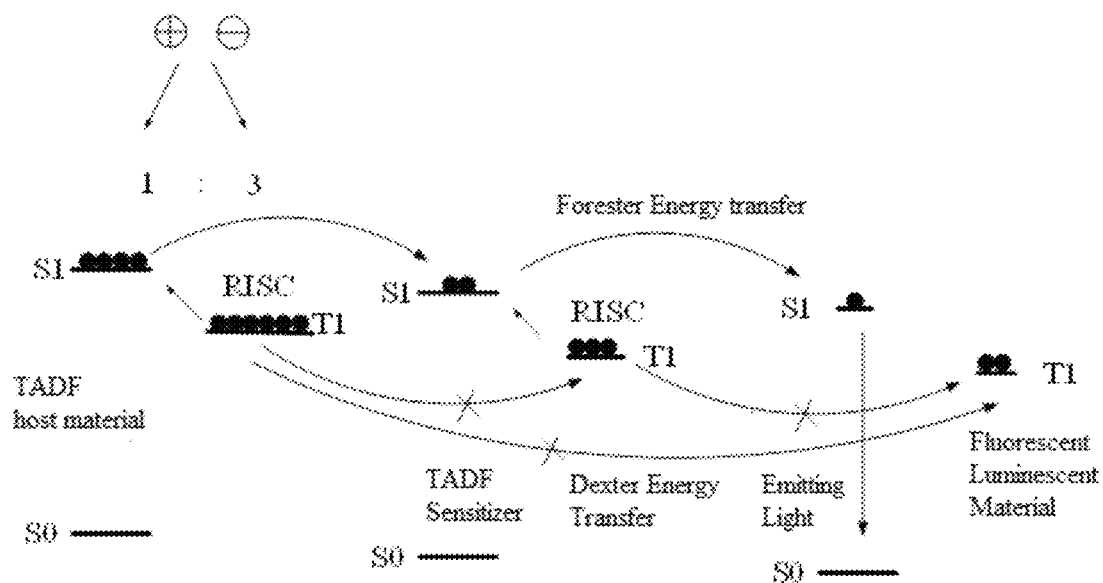
FIG. 2 illustrates a schematic diagram of an energy transfer process of each composition of an organic luminescent material according to an embodiment of the present disclosure, wherein a host material is a TADF material.
Figure 3:
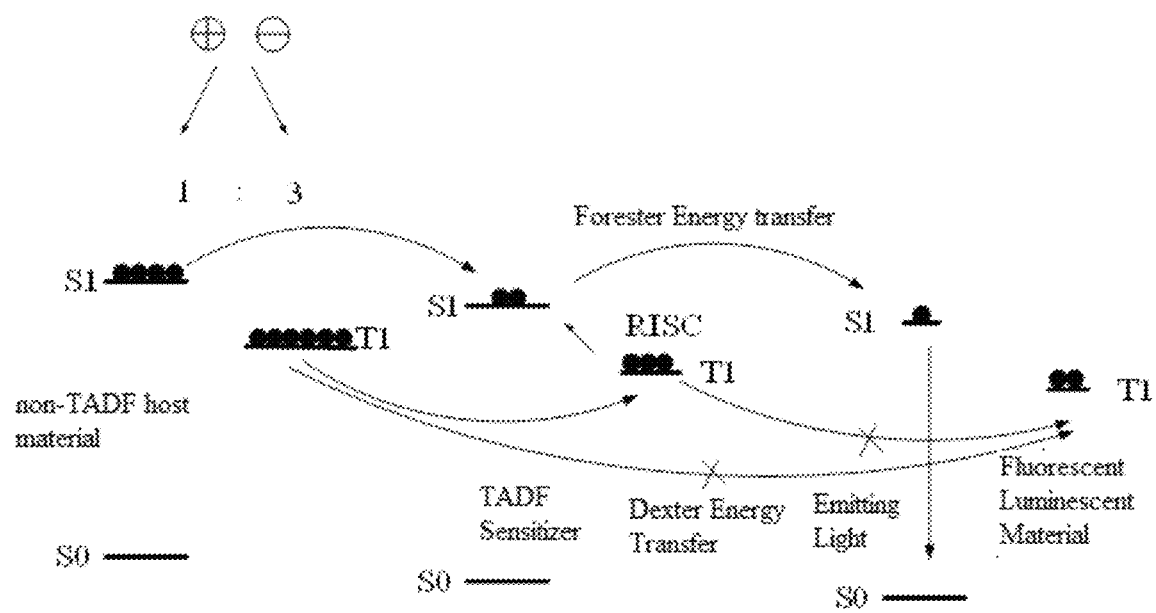
FIG. 3 illustrates a schematic diagram of an energy transfer process of each composition of an organic luminescent material according to another embodiment of the present disclosure, wherein a host material is a non-TADF material.

FIG. 2 illustrates a schematic diagram of energy transfer processes of each composition of an organic luminescent material according to an embodiment of the present disclosure, wherein a host material is a TADF material. FIG. 3 illustrates a schematic diagram of energy transfer processes of each composition of an organic luminescent material according to another embodiment of the present disclosure, wherein a host material is a non-TADF material. The host material refers to a material with a relatively high mole ratio in the organic luminescent material.

Referring to FIGS. 2 and 3, organic molecules which are in an excited state due for absorbing energy are called excitons (black spheres). The excitons may be in a singlet S1 and a triplet T1, and a ratio of the number of the excitons in the singlet state S1 and to the number of the excitons in the triplet state is 1:3. An exciton in which spin directions of an electron-hole pair are opposite is called a singlet S1 exciton. According to the principles of quantum mechanics, a singlet S1 exciton is allowed to transition to a ground state S0. An exciton in which pin directions an electron-hole pairs are same, is called a triplet T1 exciton. A triplet T1 exciton is forbidden to transition to the ground state S0.

In some embodiments of the present disclosure, the host material is a TADF material. The TADF material refers to an organic substance with thermally activated delayed fluorescence (TADF) characteristics. Referring to FIG. 2, in the TADF material, a triplet T1 exciton may transition to a singlet S1 exciton through reverse intersystem crossing (RISC).

In some embodiments of the present disclosure, the host material is a non-TADF host material.

Referring to FIG. 3, the non-TADF material refers to a material in which a difference between the triplet T1 energy level and the singlet S1 energy level is great, which makes it difficult for the triplet T1 exciton to transition to the singlet state S1 through the RISC.

In some embodiments of the present disclosure, the host material includes a TADF host material and a non-TADF host material.

Due to a phenomenon that excitons of some state quench upon reaching a certain concentration, e.g. Triplet-Triplet Annihilation (TTA). In order to prolong the light-emitting life, energy of the singlet S1 exciton of the host material is transferred to a singlet S1 exciton of other materials, instead of accumulating a large number of singlet S1 excitons at recombination sites, and the singlet S1 excitons are transitioned to the ground state S0 to emit light in a short time.

TADF sensitizer refers to a material which has thermally activated delayed fluorescence (TADF) characteristics and has a relatively low mole ratio in the organic luminescent material.

As illustrated in FIG. 3, the TADF sensitizer can transfer energy of the triplet T1 exciton of the non-TADF material to the triplet T1 exciton of the TADF sensitizer through Dexter energy transfer; then the triplet T1 exciton of the TADF sensitizer transfers the energy to the singlet S1 exciton of the TADF sensitizer through TADF; energy of the singlet S1 exciton of the TADF sensitizer is transferred to a singlet S1 exciton of the fluorescent luminescent material through the Forster energy transfer, and the singlet S1 exciton of the fluorescent luminescent material transitions back to the ground state S0 to emit light.

Referring to FIG. 2, the TADF sensitizer may further transfer the energy of the singlet S1 exciton of the TADF host material to the singlet S1 exciton of the TADF sensitizer through the Forster energy transfer; and energy of the singlet S1 exciton of the TADF sensitizer is transferred to the singlet S1 exciton of the fluorescent luminescent material through the Forster energy transfer, and the singlet S1 exciton of the fluorescent luminescent material transitions back to the ground state S0 to emit light.

An absolute value of a difference between an LUMO energy level of the host material and an LUMO energy level of the TADF sensitizer is less than or equal to 0.4 eV. Since a mole ratio of the host material is much greater than a mole ratio of the TADF sensitizer, in a case that the difference between the LUMO energy level of the host material and the LUMO energy level of the TADF sensitizer is not great, electrons may transition into the LUMO energy level of the host material;

An absolute value of a difference between a HOMO energy level of the host material and a HOMO energy level of the TADF sensitizer is less than or equal to 0.4 eV. Since the mole ratio of the host material is much greater than the mole ratio of the TADF sensitizer, in a case that the difference between the HOMO energy level of the host material and the HOMO energy level of TADF sensitizer is not great, holes may transition into the HOMO energy level of the host material.

An absolute value of a LUMO energy level of the fluorescent material is less than or equal to an absolute value of the LUMO energy level of the host material, the absolute value of the LUMO energy level of the fluorescent material is less than or equal to an absolute value of the LUMO energy level of the TADF sensitizer, the LUMO energy levels are negative values, the LUMO energy level of the fluorescent luminescent material is not lower than the LUMO energy level of the host material or the LUMO energy level of the TADF sensitizer, so that electrons will not be trapped in the LUMO energy level of the fluorescent luminescent material, and recombination of electrons mainly in the fluorescent luminescent material is avoided.

An absolute value of a HOMO energy level of the fluorescent luminescent material is greater than or equal to an absolute value of the HOMO energy level of the host material, and the absolute value of the HOMO energy level of the fluorescent luminescent material is greater than or equal to an absolute value of the HOMO energy level of the TADF sensitizer, and the HOMO energy levels are negative values, the HOMO energy level of the fluorescent luminescent material is not higher than the HOMO energy level of the host material or the HOMO energy level of the TADF sensitizer, so that holes will not be trapped in the HOMO energy level of the fluorescent luminescent material and recombination of holes mainly in the fluorescent luminescent material is avoided.

Avoiding the recombination of electrons and holes mainly in the fluorescent luminescent material can avoid recombination of a large number of electron-hole pairs in the fluorescent luminescent material in a short time and deteriorating of the fluorescent luminescent material due to destroying the chemical bonds by the high energy, thereby prolonging the life.

In summary, referring to FIGS. 2 and 3 again, in a case that the host material has more electrons and more holes, the electrons and holes are mainly recombined in the host material. The recombination of electrons and holes mainly in the host material can generate a large number of singlet S1 excitons and a large number of triplet T1 excitons. For the TADF host material, the triplet T1 exciton may transition to the singlet S1 of the TADF host material through RISC. Therefore, the Dexter energy transfer from the triplet T1 exciton of the TADF host material to the triplet T1 exciton of the TADF sensitizer and the Dexter energy transfer from the triplet T1 exciton of the TADF host material to the triplet T1 exciton of the fluorescent luminescent material may be suppressed, thereby improving luminous efficiency.

For non-TADF host materials, energy of the triplet T1 exciton may be transferred to the triplet T1 exciton of the TADF sensitizer through the Dexter energy transfer, and the triplet T1 exciton of the TADF sensitizer transitions to the singlet S1 of the TADF sensitizer through RISC. Therefore, the Dexter energy transfer from the triplet T1 exciton of the non-TADF host material to the triplet T1 exciton of the fluorescent luminescent material and the Dexter energy transfer from the triplet T1 exciton of the TADF sensitizer to the triplet T1 exciton of the fluorescent luminescent material may be suppressed, thereby improving luminous efficiency.

An emission spectrum of the host material overlaps an absorption spectrum of the TADF sensitizer, and an emission spectrum of the TADF sensitizer overlaps an absorption spectrum of the fluorescent material, which may ensure that energy of the singlet S1 exciton of the host material can be transferred to the singlet S1 exciton of the TADF sensitizer through the Forster energy transfer, energy of the singlet S1 exciton of the TADF sensitizer can be transferred to the singlet S1 exciton of the fluorescent luminescent material through the Forster energy transfer, and the singlet S1 exciton of the fluorescent luminescent material may transition to the ground state S0 to emit light. The Forster energy transfer refers to "long-distance" non-irradiative energy transfer.

Through the change of the above-mentioned energy levels, the electrons and holes of the organic luminescent material are controlled to recombine mainly in the host material. Electrons and holes are recombined mainly in the host material, which means that the probability of recombination of electrons and holes in the TADF sensitizer becomes smaller, and the number of triplet T1 excitons in the TADF sensitizer is smaller. Therefore, the Dexter energy transfer from the triplet T1 exciton of the TADF sensitizer to the triplet T1 exciton of the fluorescent luminescent material may be suppressed, thereby improving the luminous efficiency.

In summary, in a case that the host material is a TADF host material, the Dexter energy transfer from the triplet T1 exciton of the TADF host material to the triplet T1 exciton of the fluorescent material, the Dexter energy transfer from the triplet T1 exciton of the TADF host material to the triplet T1 of the TADF sensitizer, and the Dexter energy transfer from the triplet T1 exciton of the TADF sensitizer to the triplet T1 exciton of the fluorescent material, can be suppressed. In a case that the host material is a non-TADF host material, the Dexter energy transfer from the triplet T1 exciton of the non-TADF host material to the triplet T1 exciton of the fluorescent luminescent material, and the Dexter energy transfer from the triplet T1 exciton of the TADF sensitizer to the triplet T1 excitons of the fluorescent luminescent material can be suppressed. Suppressing the Dexter energy transfer can improve luminous efficiency. In addition, with respect to a non-TADF host material, an organic luminescent material including a TADF host material has higher luminous efficiency.

In some embodiments of the present disclosure, a maximum value of a difference between the singlet S1 energy level and the triplet T1 energy level of the TADF host material is 0.25 eV, which facilitates the triplet state T1 excitons of the TADF host material to transition through the RISC.

In some embodiments of the present disclosure, the maximum value of the energy level difference between the singlet state S1 of the TADF sensitizer and the triplet state T1 of the TADF sensitizer is 0.25 eV, which facilitates the RISC of the triplet T1 excitons of the TADF sensitizer.

In some embodiments of the present disclosure, in a case that a sum of a mole ratio of the host material, a mole ratio of the TADF sensitizer, and a mole ratio of the fluorescent material is 100%, the mole ratio of the host material ranges from 50% to 95%, the mole ratio of the TADF sensitizer ranges from 5% to 50%, and the mole ratio of fluorescent materials ranges from 0.2% to 4%.

In some embodiments of the present disclosure, the mole ratio of the host material ranges from 60% to 95%, the mole ratio of TADF sensitizer ranges from 5% to 40%, and the mole ratio of fluorescent material ranges from 0.5%.~2%.

In some embodiments of the present disclosure, the organic luminescent material may further include other auxiliary materials to achieve other functions, that is, the sum of the mole ratio of the host material, the mole ratio of the TADF sensitizer, and the mole ratio of the fluorescent luminescent material is less than 100%.

In some embodiments of the present disclosure, the triplet T1 energy level of the host material is greater than the triplet T1 energy level of the TADF sensitizer, and the triplet T1 energy level of the TADF sensitizer is greater than the triplet T1 energy level of the fluorescent luminescent material, which prevents the energy of the triplet T1 exciton of the fluorescent material from being transferred to the triplet T1 exciton of the host material, and/or prevents the energy of the triplet T1 exciton of the fluorescent material from being transferred to the triplet T1 exciton of the TADF sensitizer, which affects the luminous efficiency.

In some embodiments of the present disclosure, the host material and the TADF sensitizer do not generate spectra different from their respective intrinsic spectra, that is, they do not generate exciplexes. The exciplexes will change the luminescence properties of the host material and the TADF sensitizer, resulting in an unreliable performance.

In some embodiments of the present disclosure, emission spectra of the host material and the TADF sensitizer may also overlap an absorption spectrum of the fluorescent material.

According to the above-mentioned embodiments of the present disclosure, the absolute value of the difference between the LUMO energy level of the host material and the LUMO energy level of the TADF sensitizer is greater than or equal to 0 and is less than or equal to 0.4 eV, as the mole ratio of the host material is much greater than that of the TADF sensitizer, in a case that the difference between the LUMO energy level of the host material and the LUMO energy level of the TADF sensitizer is not great, electrons transition into the LUMO energy level of the host material. The absolute value of the difference between the HOMO energy level of the host material and the HOMO energy level of the TADF sensitizer is greater than 0 and is less than or equal to 0.4 eV, as the mole ratio of the host material is much greater than the mole ratio of the TADF sensitizer, in a case that the difference between the HOMO energy level of the host material and the HOMO energy level of the TADF sensitizer is not great, holes transition into the HOMO energy level of the host material. In a case that the host material has more electrons and more holes, the electrons and the holes are recombined mainly in the host material.

An absolute value of the LUMO energy level of the fluorescent luminescent material is not higher than an absolute value of the LUMO energy level of the host material, and the absolute value of the LUMO energy level of the fluorescent luminescent material is not higher than an absolute value of the LUMO energy level of the TADF sensitizer, and the LUMO energy levels are negative values, the LUMO energy level of the fluorescent luminescent material is not lower than the LUMO energy levels of the host material and the TADF sensitizer, so that electrons will not be trapped in the LUMO energy level of the fluorescent luminescent material and avoid recombination mainly in the fluorescent luminescent material to emit light.

An absolute value of the HOMO energy level of the fluorescent luminescent material is not lower than an absolute value of the HOMO energy level of the host material, and the absolute value of the HOMO energy level of the fluorescent luminescent material is not lower than an absolute value of the HOMO energy level of the TADF sensitizer. The HOMO energy levels are negative values, the HOMO energy level of the fluorescent luminescent material is not higher than the HOMO energy levels of the host material and the TADF sensitizer, so that holes will not be trapped in the HOMO energy level of the fluorescent luminescent material and avoid recombination mainly in the fluorescent luminescent material to emit light.

An emission spectrum of the host material overlaps an absorption spectrum of the TADF sensitizer, and an emission spectrum of the TADF sensitizer overlaps an absorption spectrum of the fluorescent luminescent material, which can guarantee that the Forster energy transfer from the singlet excitons of the host material to the singlet excitons of the TADF sensitizer and the Forster energy transfer from the singlet excitons of the TADF sensitizer to the singlet excitons of the fluorescent luminescent material, and the singlet excitons of the fluorescent luminescent material emit light in a case that it transitions to the ground state. The Forster energy transfer is a "long-distance" non-irradiative energy transfer.

By setting the relationship between the HOMO energy levels and the LUMO energy levels of the host material, the TADF sensitizer and the fluorescent luminescent material of the organic luminescent material, the electrons and holes in the organic luminescent material can be recombined mainly in the host material. The recombination of electrons and holes mainly in the host material can generate a large number of singlet excitons and triplet excitons. For the TADF host material, the triplet excitons of the TADF host material can transition to the singlet state of the TADF host material through reverse intersystem crossing (RISC). Therefore, the Dexter energy transfer from the triplet excitons of the TADF host material to the triplet excitons of the fluorescent luminescent material can be suppressed, and the Dexter energy transfer from the triplet excitons of the TADF sensitizer to the triplet excitons of the fluorescent luminescent material can also be suppressed, and the Dexter energy transfer is a "short distance" non-irradiative energy transfer, thereby improving luminous efficiency.

For non-TADF host materials, energy of the triplet excitons of the non-TADF host material may be transferred to the triplet excitons of the TADF sensitizer through the Dexter energy transfer, and the triplet excitons of the TADF sensitizer transition to the singlet of the TADF sensitizer through RISC. Therefore, the Dexter energy transfer from the triplet excitons of the non-TADF host material to the triplet excitons of the fluorescent luminescent material can be suppressed, thereby improving the luminous efficiency.

The electrons and holes are recombined mainly in the host material, which also means that the probability of electrons and holes recombining in the TADF sensitizer becomes smaller, and the number of triplet excitons of the TADF sensitizer is smaller. Therefore, the Dexter energy transfer from the triplet excitons of the TADF sensitizer to the triplet excitons of the fluorescent luminescent material can be suppressed, thereby improving the luminous efficiency.

Figure 4:
FIG. 4 illustrates a schematic structural diagram of an organic electroluminescence element according to an embodiment of the present disclosure.

FIG. 4 illustrates a schematic structural diagram of an organic electroluminescence element according to an embodiment of the present disclosure. As illustrated in FIG. 4, the organic electroluminescence element 1 includes an anode A, a cathode C, and an organic light-emitting layer EML disposed between the anode A and the cathode C. Material of the organic light-emitting layer EML includes any of the above-mentioned organic luminescent materials.

Figure 5:
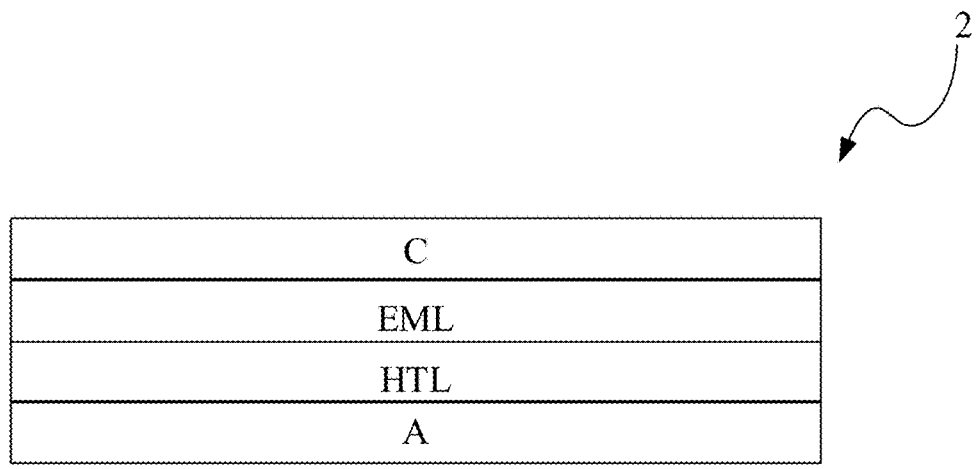
FIG. 5 illustrates a schematic structural diagram of an organic electroluminescence element according to another embodiment of the present disclosure.

FIG. 5 illustrates a schematic structural diagram of an organic electroluminescence element according to another embodiment of the present disclosure. As illustrated in FIG. 5, the structure of the organic electroluminescent element 2 is substantially the same as that of the organic electroluminescent element 1 as illustrated in FIG. 4, except that the organic electroluminescent element 2 further includes a hole transport layer HTL disposed between the anode A and the organic light-emitting layer EML, wherein the hole transport layer HTL is in contact with the organic light emitting layer EML.

The hole transport layer HTL includes a hole transport material, and a difference between a HOMO energy level of the hole transport material and the HOMO energy level of the host material is less than 0.2 eV, so that holes may be easily injected into the organic light-emitting layer EML through a barrier, which avoids a large driving voltage and a low luminous efficiency.

In some embodiments of the present disclosure, a triplet T1 energy level of the hole transport material is greater than the triplet T1 energy level of the host material, and the triplet T1 energy level of the hole transport material is greater than the triplet T1 energy level of the TADF sensitizer, and the triplet T1 energy level of the hole transport material is greater than the triplet T1 energy level of the fluorescent luminescent material. In this way, the energy of the excitons of the host material, the TADF sensitizer, and the fluorescent luminescent material can be prevented from being transferred to the excitons of the hole transport material, which avoids affecting the luminous efficiency.

Figure 6:
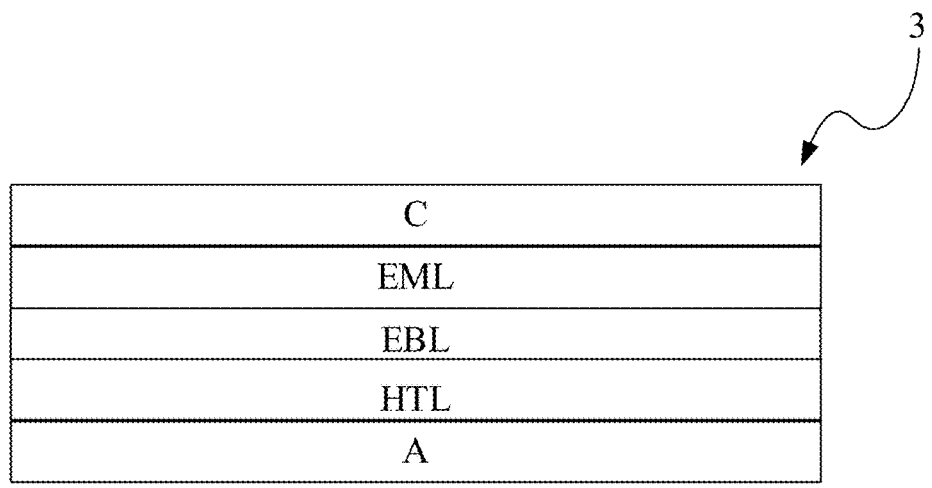
FIG. 6 illustrates a schematic structural diagram of an organic electroluminescence element according to still another embodiment of the present disclosure.

FIG. 6 illustrates a schematic structural diagram of an organic electroluminescence element according to another embodiment of the present disclosure. Referring to FIG. 6, the organic electroluminescent element 3 of the present embodiment has substantially the same structure as the organic electroluminescent element 1 as illustrated in FIG. 4, except that the organic electroluminescent element 3 further includes a hole transport layer HTL and an electron blocking layer EBL disposed between the anode A and the organic light emitting layer EML. The hole transport layer HTL is disposed close to the anode A, and the electron blocking layer EBL is disposed close to the organic light emitting layer EML. Material of the organic light-emitting layer EML includes any one of the above organic light emitting materials.

The electron blocking layer EBL is in contact with the organic light-emitting layer EML. The electron blocking layer EBL includes an electron blocking material; a difference between a HOMO energy level of the electron blocking material and a HOMO energy level of the host material is less than 0.2 eV, which makes it easy for electrons to cross the barrier and inject into the organic light emitting layer EML, avoiding a high driving voltage and a low luminous efficiency.

In some embodiments of the present disclosure, the triplet T1 energy level of the electron blocking material is greater than the triplet T1 energy level of the host material, and the triplet T1 energy level of the electron blocking material is greater than the triplet T1 energy level of the TADF sensitizer. The triplet T1 energy level of the blocking material is greater than the triplet T1 energy level of the fluorescent luminescent material. In this way, energy of the excitons of the host material, the TADF sensitizer, and the fluorescent luminescent material can be prevented from being transferred to the excitons of the electron blocking material, which avoids affecting the luminous efficiency.

Figure 7:
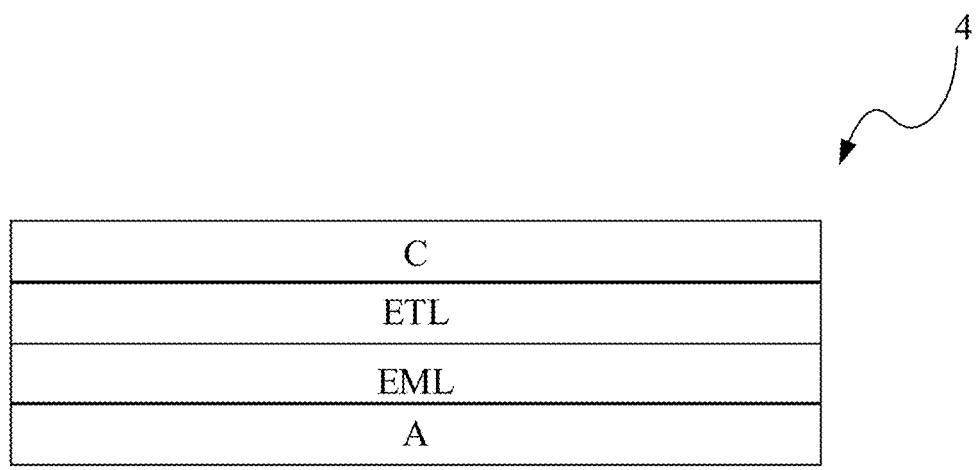
FIG. 7 illustrates a schematic structural diagram of an organic electroluminescence element according to yet another embodiment of the present disclosure.

FIG. 7 illustrates a schematic structural diagram of an organic electroluminescence element according to another embodiment of the present disclosure. As illustrated in FIG. 7, the organic electroluminescent element 4 has a structure substantially same to those of the organic electroluminescence elements 1, 2 and 3, and the difference lies in that: the organic electroluminescent element 4 further includes an electron transport layer ETL disposed between the cathode C and the organic light emitting layer EML.

The electron transport layer ETL is in contact with the organic light emitting layer EML. The electron transport layer ETL includes an electron transport material. A difference between an LUMO energy level of the electron transport material and the LUMO energy level of the host material is less than 0.2 eV, which makes it easy for electrons to cross the barrier and inject into the organic light emitting layer EML, avoiding a high driving voltage and a low luminous efficiency.

In some embodiments of the present disclosure, the triplet T1 energy level of the electron transport material is greater than the triplet T1 energy level of the host material, and the triplet T1 energy level of the electron transport material is greater than the triplet T1 energy level of the TADF sensitizer. The triplet T1 energy level of the electron transport material is greater than the triplet T1 energy level of the fluorescent luminescent material. In this way, energy of the excitons of the host material, the TADF sensitizer, and the fluorescent luminescent material can be prevented from being transferred to the excitons of the electron transport material, which avoids affecting the luminous efficiency.

Figure 8:
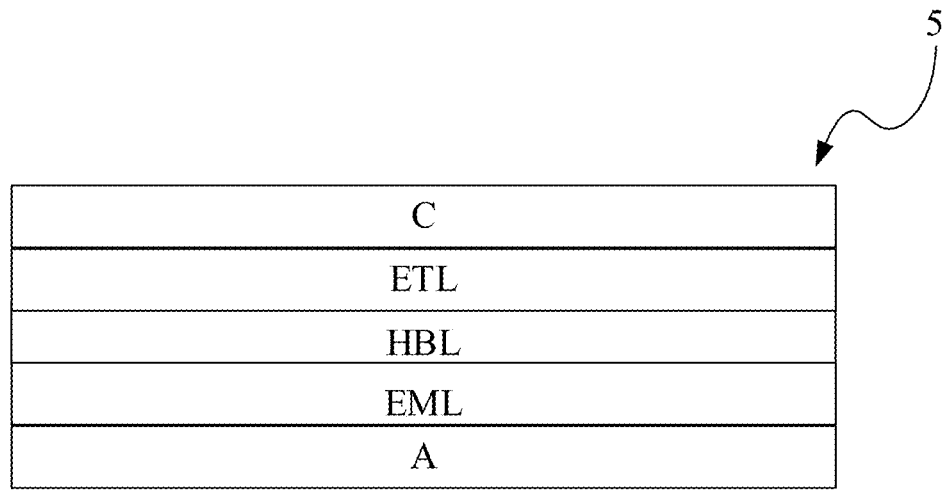
FIG. 8 illustrates a schematic structural diagram of an organic electroluminescence element according to still another embodiment of the present disclosure.

FIG. 8 illustrates a schematic structural diagram of an organic electroluminescence element according to another embodiment of the present disclosure. As illustrated FIG. 8, the organic electroluminescent element 5 has a structure substantially same to the structures of the organic electroluminescent elements 1, 2, 3, and the difference only lies in that: the organic electroluminescent element 5 further includes an electron transport layer ETL and a hole clocking layer HBL, the electron transport layer ETL is disposed close to the cathode C and the hole blocking layer HBL is disposed close to the organic light-emitting layer EML.

The hole blocking layer HBL is in contact with the organic light-emitting layer EML. The hole blocking layer HBL includes a hole blocking material, and a difference between an LUMO energy level of the hole blocking material and the LUMO energy level of the host material is less than 0.2 eV, so that electrons are easily injected into the organic light-emitting layer EML through a barrier, thus, avoiding a high driving voltage and a low luminous efficiency.

In some embodiments of the present disclosure, the triplet T1 energy level of the hole blocking material is greater than the triplet T1 energy level of the host material, and the triplet T1 energy level of the hole blocking material is greater than the triplet T1 energy level of the TADF sensitizer, and the triplet T1 energy level of the hole blocking material is greater than the triplet T1 energy level of the fluorescent luminescent material. In this way, energy of the excitons of the host material, the TADF sensitizer, and the fluorescent luminescent material can be prevented from being transferred to the excitons of the hole blocking material, which avoids affecting the luminous efficiency.

In order to verify the beneficial effects of the present disclosure, control experiments have been conducted in some embodiments of the present disclosure. Organic electroluminescent elements of sample 1, sample 2, sample 3, sample 4 and control sample 1, control sample 2, control sample 3, and control sample 4 each includes: an anode A, a hole transport layer HTL, an electron blocking layer EBL, a light emitting material layer EML, a hole blocking layer HBL, an electron transport layer ETL and a cathode C, and they have the same composition and the same thickness in the anodes A, the hole transport layers HTL, the electron blocking layers EBL, the hole blocking layers HBL, the electron transport layers ETL and the cathodes C. HOMO energy levels and LUMO energy levels of TADF host materials, TADF sensitizers, and fluorescent luminescent materials of the light emitting material layers EML of the sample 1, the sample 2, the sample 3, and the sample 4 meet the conditions of the organic electroluminescent element 3 and the organic electroluminescent element 5. In the light emitting material layers EML of the control sample 1, the control sample 2, the control sample 3, and the control sample 4, HOMO energy levels and LUMO energy levels of TADF host material, TADF sensitizer, and fluorescent luminescent material do not meet the conditions of the organic electroluminescent element 1.

In the organic luminescent materials of the sample 1 and the control sample 1, a mole ratio of the TADF host material is 85%, a mole ratio of the TADF sensitizer is 14%, and a mole ratio of the fluorescent luminescent material is 1%.

In the organic luminescent materials of the sample 2 and the control sample 2, a mole ratio of the TADF host material is 80%, a mole ratio of the TADF sensitizer is 19%, and a mole ratio of the fluorescent luminescent material is 1%.

In the organic luminescent materials of the sample 3 and the control sample 3, a mole ratio of the TADF host material is 75%, a mole ratio of the TADF sensitizer is 24%, and a mole ratio of the fluorescent luminescent material is 1%.

In the organic luminescent materials of the sample 4 and the control sample 4, a mole ratio of the TADF host material is 70%, a mole ratio of the TADF sensitizer is 29%, and a mole ratio of the fluorescent luminescent material is 1%.

Figure 9:
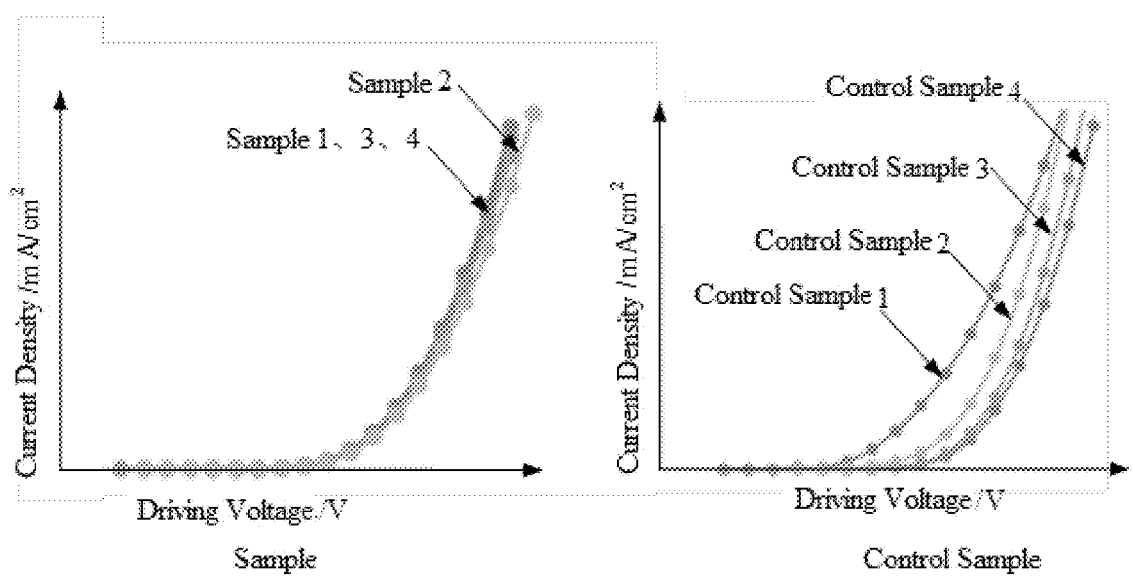
FIG. 9 illustrates a graph of current density of samples 1 to 4, and control samples 1 to 4 as a function of driving voltages.

FIG. 9 illustrates a graph of the current density of samples 1 to 4 and control samples 1 to 4 as a function of driving voltage. Table 1 illustrates a comparison table of driving voltage and light intensity of the sample 3 and the control sample 3 at a same current density.

TABLE 1

| Sample | Driving voltage/V | Eff.(cd/A) |
| --- | --- | --- |
| Sample 3 | 4.12 | 19.4 |
| Control Sample 3 | 4.34 | 14.3 |

The position of carrier recombination can be determined from the change of the J-V curve as illustrated in FIG. 9, and the doping concentration changes electron hopping distance. If the excitons are recombined in the TADF host material, the J-V curve does not change with a doping concentration of the TADF sensitizers, and on the contrary, different concentrations will make the J-V curve change.

It can be seen from the Table 1 that, with respect to the control sample 3, the sample 3 may reduce the driving voltage and increase the light intensity. The light intensity reflects a current efficiency, thus increasing the luminous efficiency.

Based on the aforementioned organic electroluminescent elements 1, 2, 3, 4, and 5, at least one embodiment of the present disclosure further provides a display device including any one of the aforementioned organic electroluminescent elements 1, 2, 3, 4, and 5. A plurality of organic electroluminescence elements are arranged in an array. The display device can be any product or component with display function, such as an electronic paper, a mobile phone, a tablet computer, a television, a laptop computer, a digital photo frame, a navigator, etc.

It should be understood that in the drawings, sizes of layers and regions may be exaggerated for clarity of illustration. It will further be understood that in a case that an element or layer is referred to as being "on" another element or layer, it can be directly on the other element or intervening layers may be present. In addition, it will be understood that in a case that an element or layer is referred to as being "under" another element or layer, it can be directly under the other element, or there may be at least one intervening layer or element. In addition, it can further be understood that in a case that a layer or element is referred to as being "between" two layers or elements, it can be the only layer between the two layers or elements, or more than one intervening layer or component may also be present. Similar reference numerals indicate similar elements throughout the specification.

In the present disclosure, the terms "first" and "second" are only used for descriptive purposes, and cannot be construed as indicating or implying relative importance.

Those skilled in the art will easily conceive of other embodiments of the present disclosure after reading the specification and practicing the disclosure disclosed herein. The present disclosure is intended to cover any variations, applications, or modifications of the present disclosure. These variations, applications, or modifications follow the general principles of the present disclosure and include common knowledge or conventional technical means in the technical field that are not disclosed in the present disclosure. The description and the embodiments are to be regarded as exemplary only, and the true scope and spirit of the present disclosure are pointed out by the following claims.

It should be understood that the present disclosure is not limited to the exact structures that has been described above and illustrated in the drawings, and various modifications and variants can be made without departing from its scope. The scope of the present disclosure is only limited by the appended claims.

The invention claimed is:

1. An organic luminescent material, comprising: a host material, a thermally activated delayed fluorescence (TADF) sensitizer, and a fluorescent luminescent material; wherein
an absolute value of a difference between an LUMO energy level of the host material and an LUMO energy level of the TADF sensitizer is less than or equal to 0.4 eV, and an absolute value of a difference between a HOMO energy level of the host material and a HOMO energy level of the TADF sensitizer is less than or equal to 0.4 eV;
at least one of the following is satisfied:
an absolute value of an LUMO energy level of the fluorescent luminescent material is less than or equal to an absolute value of the LUMO energy level of the host material, and the absolute value of the LUMO energy level of the fluorescent luminescent material is less than or equal to an absolute value of the LUMO energy level of the TADF sensitizer; or
an absolute value of a HOMO energy level of the fluorescent luminescent material is greater than or equal to an absolute value of the HOMO energy level of the host material and the absolute value of the HOMO energy level of the fluorescent luminescent material is greater than or equal to an absolute value of the HOMO energy level of the TADF sensitizer; and
an emission spectrum of the host material overlaps an absorption spectrum of the TADF sensitizer, and an emission spectrum of the TADF sensitizer overlaps an absorption spectrum of the fluorescent luminescent material.

2. The organic luminescent material according to claim 1, wherein the host material comprises a TADF host material.

3. The organic luminescent material according to claim 2, wherein a maximum value of a difference between a singlet energy level of the TADF host material and a triplet energy level of the TADF host material is 0.25 eV.

4. The organic luminescent material according to claim 1, wherein the host material comprises a non-TADF host material.

5. The organic luminescent material according to claim 1, wherein a maximum value of a difference between a singlet energy level of the TADF sensitizer and a triplet energy level of the TADF sensitizer is 0.25 eV.

6. The organic luminescent material according to claim 1, wherein a mole ratio of the host material ranges from 50% to 95%, and a mole ratio of the TADF sensitizer ranges from 5% to 50%, a mole ratio of the fluorescent luminescent material ranges from 0.2% to 4%, and a sum of the mole ratio of the host material, the mole ratio of the TADF sensitizer, and the mole ratio of the fluorescent luminescent material is 100%.

7. The organic luminescent material according to claim 1, wherein a mole ratio of the host material ranges from 56% to 95%, and a mole ratio of the TADF sensitizer ranges from 5% to 40%, a mole ratio of the fluorescent luminescent material ranges from 0.5% to 2%, and a sum of the mole ratio of the host material, the mole ratio of the TADF sensitizer, and the mole ratio of the fluorescent luminescent material is 100%.

8. The organic luminescent material according to claim 1, wherein a triplet energy level of the host material is greater than a triplet energy level of the TADF sensitizer, and the triplet energy level of the TADF sensitizer is greater than a triplet energy level of the fluorescent luminescent material.

9. An organic electroluminescence element, comprising: an anode, a cathode, and an organic light-emitting layer disposed between the anode and the cathode, and material of the organic light-emitting layer includes a host material, a TADF sensitizer, and a fluorescent luminescent material; wherein
an absolute value of a difference between an LUMO energy level of the host material and an LUMO energy level of the TADF sensitizer is less than or equal to 0.4 eV, and an absolute value of a difference between a HOMO energy level of the host material and a HOMO energy level of the TADF sensitizer is less than or equal to 0.4 eV;
at least one of the following is satisfied:
an absolute value of an LUMO energy level of the fluorescent luminescent material is less than or equal to an absolute value of the LUMO energy level of the host material, and the absolute value of the LUMO energy level of the fluorescent luminescent material is less than or equal to an absolute value of the LUMO energy level of the TADF sensitizer; or
an absolute value of a HOMO energy level of the fluorescent luminescent material is greater than or equal to an absolute value of the HOMO energy level of the host material and the absolute value of the HOMO energy level of the fluorescent luminescent material is greater than or equal to an absolute value of the HOMO energy level of the TADF sensitizer; and
an emission spectrum of the host material overlaps an absorption spectrum of the TADF sensitizer, and an emission spectrum of the TADF sensitizer overlaps an absorption spectrum of the fluorescent luminescent material.

10. The organic electroluminescence element according to claim 9, further comprising a hole transport layer disposed between the anode and the organic light emitting layer, the hole transport layer comprising a hole transport material; wherein
a difference between a HOMO energy level of the hole transport layer and the HOMO energy level of the host material is less than 0.2 eV; or
a triplet energy level of the hole transport material is greater than a triplet energy level of the host material, the triplet energy level of the hole transport material is greater than a triplet energy level of the TADF sensitizer, and the triplet energy level of the hole transport material is greater than a triplet energy level of the fluorescent luminescent material.

11. The organic electroluminescence element according to claim 9, further comprising a hole transport layer and an electron blocking layer disposed between the anode and the organic light emitting layer, the hole transport layer disposed close to the anode, the electron blocking layer disposed close to the organic light-emitting layer, and the electron blocking layer comprising an electron blocking material; wherein
a difference between a HOMO energy level of the electron blocking material and the HOMO energy level of the host material is less than 0.2 eV; or
a triplet energy level of the electron blocking material is greater than a triplet energy level of the host material, the triplet energy level of the electron blocking material is greater than a triplet energy level of the TADF sensitizer, and the triplet energy level of the electron blocking material is greater than a triplet energy level of the fluorescent luminescent material.

12. The organic electroluminescence element according to claim 9, further comprising an electron transport layer disposed between the cathode and the organic light emitting layer, and the electron transport layer comprising an electron transport material; wherein
    a difference between an LUMO energy level of the electron transport material and the LUMO energy level of the host material is less than 0.2 eV; or
    a triplet energy level of the electron transport material is greater than a triplet energy level of the host material, the triplet energy level of the electron transport material is greater than a triplet energy level of the TADF sensitizer, and the triplet energy level of the electron transport material is greater than a triplet energy level of the fluorescent luminescent material.

13. The organic electroluminescence element according to claim 9, further comprising an electron transport layer and a hole blocking layer disposed between the cathode and the organic light emitting layer, the electron transport layer disposed close to the cathode, the hole blocking layer disposed close to the organic light-emitting layer, and the hole blocking layer comprising a hole blocking material; wherein
    a difference between an LUMO energy level of the hole blocking material and the LUMO energy level of the host material is less than 0.2 eV; or
    a triplet energy level of the hole blocking material is greater than a triplet energy level of the host material, the triplet energy level of the hole blocking material is greater than a triplet energy level of the TADF sensitizer, and the triplet energy level of the blocking material is greater than a triplet energy level of the fluorescent luminescent material.

14. The organic electroluminescence element according to claim 9, wherein the host material comprises a TADF host material.

15. The organic electroluminescence element according to claim 10, wherein a maximum value of a difference between a singlet energy level of the TADF host material and the triplet energy level of the TADF host material is 0.25 eV.

16. The organic electroluminescence element according to claim 9, wherein the host material comprises a non-TADF host material.

17. The organic electroluminescence element according to claim 9, wherein a maximum value of a difference between a singlet energy level of the TADF sensitizer and a triplet energy level of the TADF sensitizer is 0.25 eV.

18. The organic electroluminescence element according to claim 9, wherein a mole ratio of the host material ranges from 50% to 95%, and a mole ratio of the TADF sensitizer ranges from 5% to 50%, a mole ratio of the fluorescent luminescent material ranges from 0.2% to 4%, and a sum of the mole ratio of the host material, the mole ratio of the TADF sensitizer, and the mole ratio of the fluorescent luminescent material is 100%.

19. The organic electroluminescence element according to claim 9, wherein a triplet energy level of the host material is greater than a triplet energy level of the TADF sensitizer, and the triplet energy level of the TADF sensitizer is greater than a triplet energy level of the fluorescent luminescent material.

20. A display device, comprising: a plurality of organic electroluminescence elements according to claim 9, wherein the plurality of organic electroluminescence elements are arranged in array.

* * * * *